United States Patent
Liang et al.

(10) Patent No.: US 10,424,641 B1
(45) Date of Patent: Sep. 24, 2019

(54) LATERAL DEVICES IN SILICON-ON-INSULATOR (SOI) TECHNOLOGY

(71) Applicant: QUALCOMM Incorporated, San Diego, CA (US)

(72) Inventors: Qingqing Liang, San Diego, CA (US); Francesco Carobolante, Carlsbad, CA (US); Fabio Alessio Marino, San Marcos, CA (US); Narasimhulu Kanike, San Diego, CA (US); Paolo Menegoli, San Jose, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/958,185

(22) Filed: Apr. 20, 2018

(51) Int. Cl.
*H01L 29/94* (2006.01)
*H01L 29/10* (2006.01)
*H01L 29/78* (2006.01)
*H01L 29/93* (2006.01)
*H01L 29/66* (2006.01)

(52) U.S. Cl.
CPC .... *H01L 29/1045* (2013.01); *H01L 29/66174* (2013.01); *H01L 29/66181* (2013.01); *H01L 29/66189* (2013.01); *H01L 29/7816* (2013.01); *H01L 29/93* (2013.01); *H01L 29/94* (2013.01)

(58) Field of Classification Search
None
See application file for complete search history.

(56) References Cited

U.S. PATENT DOCUMENTS

| 7,622,760 B2 | 11/2009 | Ogawa et al. |
| 9,548,401 B2 | 1/2017 | Yoo et al. |
| 2006/0109607 A1 | 5/2006 | Arnborg |

(Continued)

FOREIGN PATENT DOCUMENTS

| EP | 1633005 A1 | 3/2006 |
| WO | 2014194336 A2 | 12/2014 |

OTHER PUBLICATIONS

International Search Report and Written Opinion—PCT/US2019/022402—ISA/EPO—dated May 21, 2019.

*Primary Examiner* — Evren Seven
(74) *Attorney, Agent, or Firm* — Patterson & Sheridan, L.L.P.

(57) ABSTRACT

Certain aspects of the present disclosure provide a semiconductor device. One example semiconductor device generally includes a first semiconductor region; a first non-insulative region disposed adjacent to a first lateral side of the first semiconductor region; a second non-insulative region disposed adjacent to a second lateral side of the first semiconductor region, the second lateral side being opposite to the first lateral side; a second semiconductor region disposed adjacent to a third lateral side of the first semiconductor region, the second semiconductor region and the first semiconductor region having at least one of different doping types or different doping concentrations; an insulative layer adjacent to a top side of the first semiconductor region; and a third non-insulative region, the insulative layer being disposed between the third non-insulative region and the first semiconductor region.

20 Claims, 9 Drawing Sheets

(56) References Cited

U.S. PATENT DOCUMENTS

| | | | |
|---|---|---|---|
| 2008/0237677 A1* | 10/2008 | Futatsugi | H01L 29/66075 257/312 |
| 2009/0057742 A1 | 3/2009 | Lee et al. | |
| 2012/0281336 A1* | 11/2012 | Marino | H01G 7/00 361/281 |
| 2013/0043544 A1 | 2/2013 | Erickson et al. | |
| 2013/0149829 A1* | 6/2013 | Nandakunnar | H01L 29/66477 438/294 |
| 2014/0232451 A1 | 8/2014 | Dutta | |
| 2014/0367832 A1* | 12/2014 | Marino | H01L 29/0615 257/597 |
| 2015/0194538 A1* | 7/2015 | Marino | H01L 29/94 327/530 |
| 2016/0093750 A1* | 3/2016 | Kim | H01L 29/92 327/537 |
| 2017/0358691 A1 | 12/2017 | Xiu et al. | |
| 2018/0062001 A1* | 3/2018 | Carobolante | H01L 24/08 |
| 2018/0366592 A1* | 12/2018 | Lu | H01L 29/93 |
| 2018/0374963 A1* | 12/2018 | Marino | H01L 29/93 |
| 2019/0006530 A1* | 1/2019 | Marino | H01L 29/36 |

\* cited by examiner

LATERAL DEVICES IN SILICON-ON-INSULATOR (SOI) TECHNOLOGY

TECHNICAL FIELD

Certain aspects of the present disclosure generally relate to electronic circuits and, more particularly, to semiconductor devices.

BACKGROUND

Semiconductor capacitors are fundamental components for integrated circuits. A variable capacitor is a capacitor whose capacitance may be intentionally and repeatedly changed under the influence of a bias voltage. A variable capacitor is often used in inductor-capacitor (LC) circuits to set the resonance frequency of an oscillator, or as a variable reactance, e.g., for impedance matching in antenna tuners. One example type of variable capacitor is referred to as a transcap (TC) device, which is a metal-oxide semiconductor (MOS) based variable capacitor having at least three terminals, one of which is used to modulate the capacitance across two terminals of the TC device.

A voltage-controlled oscillator (VCO) is an example circuit that may use a varactor in which the size of a depletion region formed in a p-n junction diode is varied by changing a bias voltage to alter the junction capacitance. Any junction diode exhibits this effect (including p-n junctions in transistors), but devices used as variable capacitance diodes are designed with a large junction area and a doping profile specifically chosen to improve the device performance, such as quality factor and tuning range.

SUMMARY

Certain aspects of the present disclosure generally relate to a structure for a semiconductor device that is compatible with silicon-on-insulator (SOI) technology.

Certain aspects of the present disclosure provide a semiconductor device. The semiconductor device generally includes a first semiconductor region; a first non-insulative region disposed adjacent to a first lateral side of the first semiconductor region; a second non-insulative region disposed adjacent to a second lateral side of the first semiconductor region, the second lateral side being opposite to the first lateral side; a second semiconductor region disposed adjacent to a third lateral side of the first semiconductor region, the second semiconductor region and the first semiconductor region having at least one of different doping types or different doping concentrations; an insulative layer adjacent to a top side of the first semiconductor region; and a third non-insulative region, the insulative layer being disposed between the third non-insulative region and the first semiconductor region.

Certain aspects of the present disclosure provide a method for fabricating a semiconductor device. The method generally includes forming a first semiconductor region; forming a first non-insulative region adjacent to a first lateral side of the first semiconductor region; forming a second non-insulative region adjacent to a second lateral side of the first semiconductor region, the second lateral side being opposite to the first lateral side; forming a second semiconductor region adjacent to a third lateral side of the first semiconductor region, the second semiconductor region and the first semiconductor region having at least one of different doping types or different doping concentrations; forming an insulative layer adjacent to a top side of the first semiconductor region, and forming a third non-insulative region, the insulative layer being formed between the third non-insulative region and the first semiconductor region.

BRIEF DESCRIPTION OF THE DRAWINGS

So that the manner in which the above-recited features of the present disclosure can be understood in detail, a more particular description, briefly summarized above, may be by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Certain aspects of the present disclosure are generally directed to a semiconductor device structure implemented using laterally arranged semiconductor regions.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

Example Transcap Device

Figure 1:
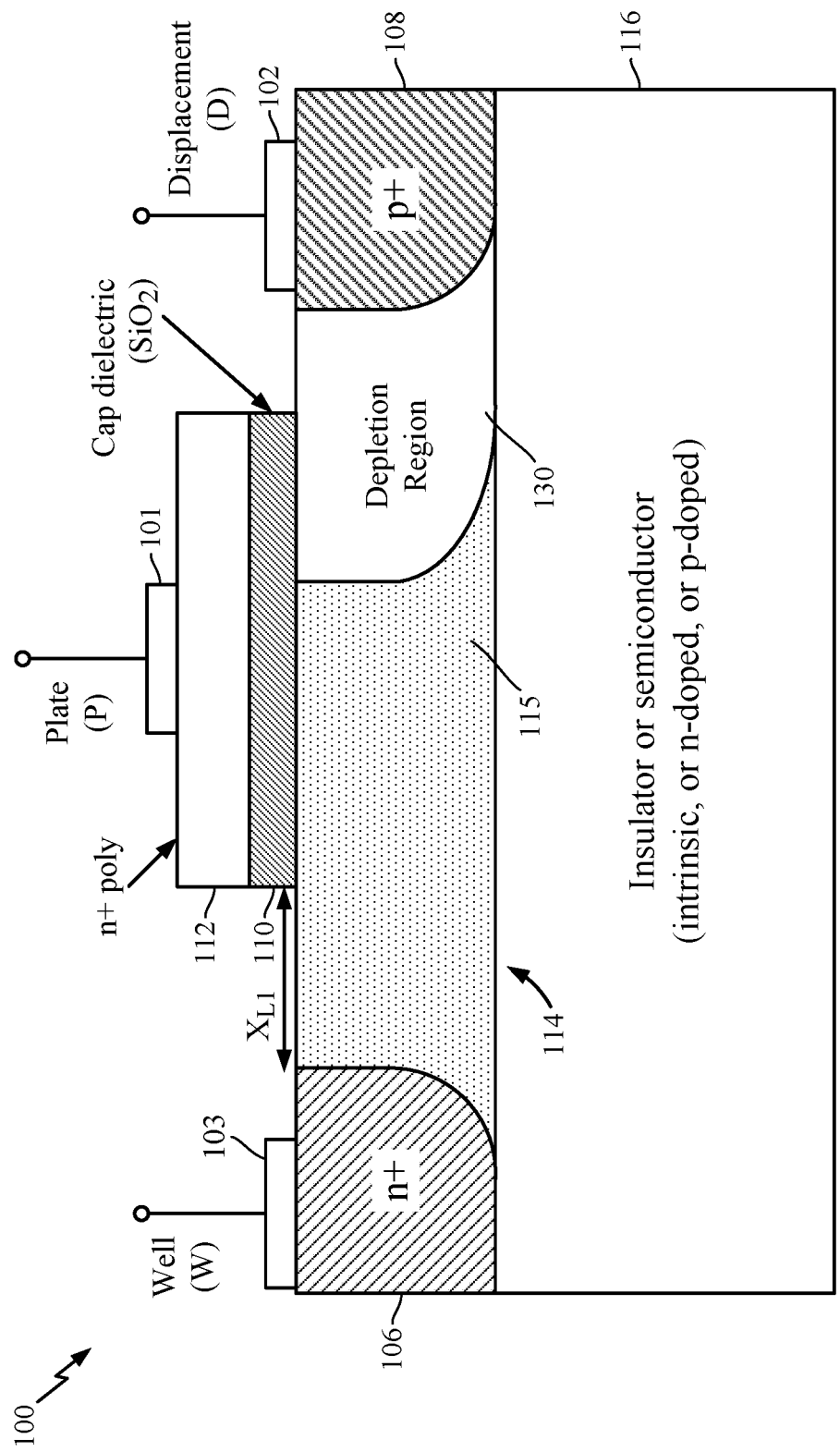
FIG. 1 illustrates a cross-sectional view of an example semiconductor device configured as a transcap device (TC).

FIG. 1 illustrates an example structure of a transcap device 100. The transcap device 100 includes a non-insulative region 112 coupled to a plate (P) terminal 101, a non-insulative region 106 coupled to a well (W) terminal 103, and a non-insulative region 108 coupled to a displacement (D) terminal 102. Certain implementations of a transcap device use a plate oxide layer 110 disposed above a semiconductor region 114. The plate oxide layer 110 may isolate the W and P terminals, and thus, in effect act as a dielectric for the transcap device 100. The non-insulative region 106 (e.g., heavily n doped region) and the non-insulative region 108 (e.g., heavily p doped region) may be formed in the semiconductor region 114 and on two sides of the transcap device 100 in order to create p-n junctions. As used herein, a non-insulative region generally refers to a region that may be conductive or semiconductive.

In certain aspects, a bias voltage may be applied between the D terminal 102 and the W terminal 103 in order to modulate the capacitance between the P and W terminals. For example, by applying a bias voltage to the D terminal 102, a depletion region 130 may be formed between the p-n junction of the non-insulative region 108 and the region 115 of the semiconductor region 114. Based on the bias voltage, this depletion region 130 may widen under the plate oxide layer 110, reducing the area of the equivalent electrode formed by the semiconductor region 114, and with it, the effective capacitance area and capacitance value of the transcap device 100. Furthermore, the bias of the W and P terminals may be set as to avoid the formation of an inverted region underneath the oxide and operate the transcap device 100 in deep depletion mode. By varying the voltage of the W terminal with respect to the P and D terminals, both vertical and horizontal depletion regions may be used to modulate the capacitance between the W and P terminals.

The work-function of the non-insulative region 112 above the plate oxide layer 110 may be chosen to improve the device performance. For example, an n-doped poly-silicon material may be used (instead of p-doped), even if the semiconductor region 114 underneath the plate oxide layer 110 is doped with n-type impurities. In some aspects, a metallic material (also doped if desired) may be used for the non-insulative region 112 with an opportune work-function or a multi-layer stack of different metallic materials to obtain the desired work-function. In certain aspects, the non-insulative region 112 may be divided into two sub-regions, one n-doped and one p-doped, or a different metallic material may be used for each sub-region.

In some cases, the semiconductor region 114 may be disposed above an insulator or region 116. The type of material for the region 116 may be chosen in order to improve the transcap device 100 performance. For example, the region 116 may be an insulator, a semi-insulator, or an intrinsic/near-intrinsic semiconductor in order to decrease the parasitic capacitances associated with the transcap device 100. In some cases, the region 116 may be made of n-doped or p-doped semiconductor with an appropriate doping profile in order to increase the transcap device quality factor (Q) and/or the control on the depletion region 130 that may be formed between the non-insulative region 108 and the region 115 of the semiconductor region 114 when applying a bias voltage to the D terminal 102. The region 116 may also be formed by multiple semiconductor layers or regions doped in different ways (n, p, or intrinsic). Furthermore, the region 116 may include semiconductors, insulating layers, and/or substrates or may be formed above semiconductors, insulating layers, and/or substrates.

To better understand the working principle of the transcap device 100, it may be assumed that the D terminal 102 is biased with a negative voltage with respect to the W terminal 103. The width of the depletion region 130 in the semiconductor region 114 may be controlled by applying a control voltage to the D terminal 102 or to the W terminal 103. The capacitance between the W and P terminals may depend on the width of the depletion region 130 in the semiconductor region 114, and thus, may be controlled by applying the control voltage to the D terminal 102. Furthermore, the variation of the bias voltage applied to the D terminal 102 may not alter the direct-current (DC) voltage between the W and P terminals, allowing for improved control of the device characteristics.

In some cases, it may be preferable to have the non-insulative region 106 and/or non-insulative region 108 a distance away from the plate oxide layer 110 in order to reduce the parasitic capacitance associated with the non-insulative region 108 and improve the isolation of the non-insulative region 106 for high control voltages. For example, the non-insulative region 106 may be partially overlapped with the plate oxide layer 110, or the non-insulative region 106 may be formed at a distance from the edge of the plate oxide layer 110 to increase the device tuning range and linearity. In the latter case, the voltage-withstanding capability of the device is improved since a portion of a radio-frequency (RF) signal, that may be applied to the P and W terminals, drops between the oxide edge and the non-insulative region 106 instead of being applied entirely across the plate oxide layer 110. The non-insulative region 108 may be partially overlapped with the plate oxide layer 110, or the non-insulative region 108 may be spaced apart from the plate oxide layer 110 so as to reduce the parasitic capacitance between the P terminal 101 and the D terminal 102.

In certain aspects, the semiconductor region 114 may be implemented with a p-well region to improve the breakdown voltage of the p-n junction between the non-insulative region 108 and the region 115 of the semiconductor region 114, decreasing, at the same time, the parasitic capacitance between the P terminal 101 and the D terminal 102. Similarly, the semiconductor region 114 may be implemented with an n-doped region between the non-insulative region 106 and region 115 of the semiconductor region 114 in order to regulate the doping concentration between the plate oxide layer 110 and the non-insulative region 106. In certain aspects of the present disclosure, the semiconductor region 114 may be implemented with two or more regions having different doping concentrations and/or different doping types. A junction between the two or more regions may be disposed below the plate oxide layer 110 to improve the Q of the transcap device 100.

Example Lateral Semiconductor Devices

In the advanced complementary metal-oxide-semiconductor (CMOS) technology, it may be difficult to improve the device doping profile, gate-oxide thickness, and contacts in the vertical direction since the junction depth may be limited by the diffusion. Therefore, profiles like super retrograde, ultra-shallow junction, and buried channel may be difficult to use in forming devices for analog applications such as variable capacitors (e.g., a TC device as described with respect to FIG. 1), field-effect transistors (FETs), and asymmetric devices.

Certain aspects of the present disclosure provide device structures for variable capacitors and metal-oxide-semiconductor field-effect transistors (MOSFETs) on silicon-on-insulator (SOI) wafers that allow for more doping profile improvement options with little to no additional process steps with respect to existing technologies. The techniques provided herein enable more device options for analog and high-voltage applications (e.g., radio frequency (RF) and automotive) with little or no cost.

Figure 2A:
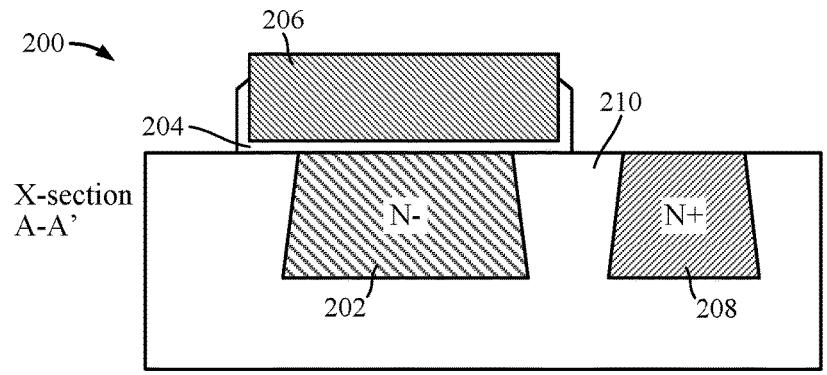
FIGS. 2A, 2B, and 2C illustrate cross-sectional views and a top-down view of an n-type TC device, in accordance with certain aspects of the present disclosure.
Figure 2B:
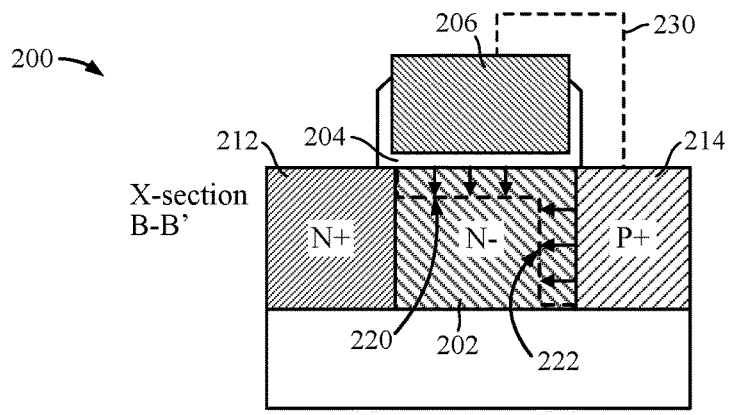
Figure 2C:
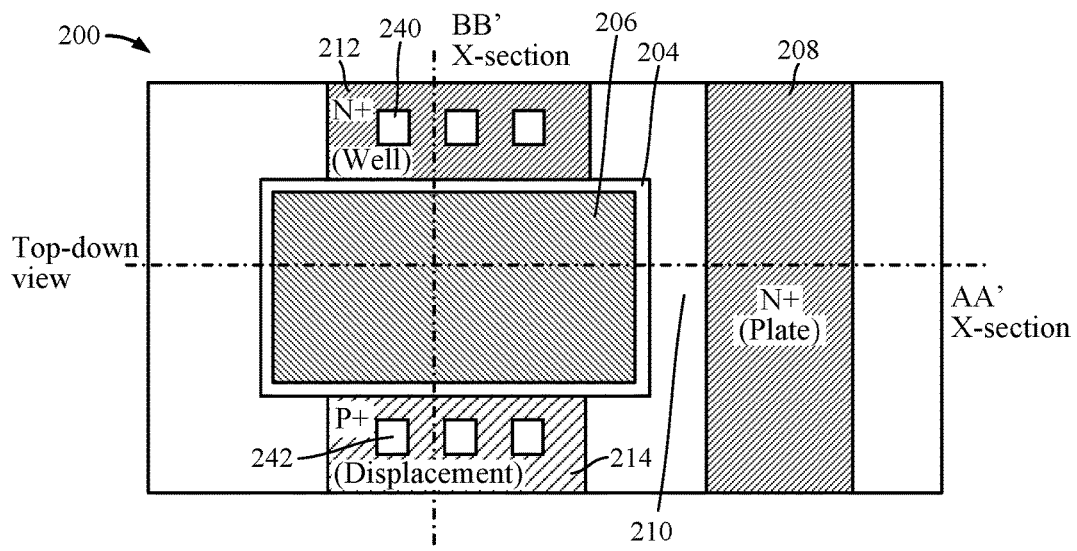

FIGS. 2A, 2B, and 2C illustrate cross-sectional views and a top-down view of an n-type TC device 200, in accordance with certain aspects of the present disclosure. FIG. 2A is a cross-section taken through line A-A' in FIG. 2C, and FIG. 2B is a cross-section taken through line B-B' in FIG. 2C. As illustrated, the TC device 200 includes a semiconductor region 202 disposed below an insulative layer 204 (e.g., plate oxide layer) for electrically isolating a non-insulative region 206 (e.g., top gate region) from the semiconductor region 202.

In certain aspects of the present disclosure, a non-insulative region 208 is disposed adjacent to a lateral side of the semiconductor region 202 and is isolated from the semiconductor region 202 by a dielectric region 210 (e.g., a shallow trench isolation (STI) region). For certain aspects, the width of the dielectric region 210 from the non-insulative region 208 to the semiconductor region 202 may be no more than 40 nanometers. As illustrated in FIG. 2B, the TC device 200 also includes non-insulative regions 212 and 214 on opposite lateral sides of the semiconductor region 202.

In certain aspects, the non-insulative regions 212 and 214 are implemented as semiconductor regions having opposite doping types. In addition, the non-insulative region 212 and the non-insulative region 208 are implemented as semiconductor regions having the same doping type. Thus, the non-insulative regions 208 and 212 are configured as the plate and well regions, respectively, of the TC device 200, and the non-insulative region 214 is configured as the displacement region of the TC device 200. In this case, a control voltage may be applied to the non-insulative region 214 (displacement region) with respect to either the non-insulative region 208 or 212 in order to adjust the capacitance between the non-insulative regions 208 and 212.

The TC device 200 is configured as an n-type TC device since the semiconductor region 202 and the non-insulative regions 208 and 212 are implemented with n-type semiconductors. In certain aspects, one or more contacts 240 may be disposed above the non-insulative region 212, and one or more contacts 242 may be disposed above the non-insulative region 214, to allow for electrical contact with the non-insulative regions 212 and 214.

In certain aspects of the present disclosure, the non-insulative region 206 (e.g., top gate region) may be used to modulate the depletion region formed in the semiconductor region 202. By applying a control voltage to the non-insulative region 206, a vertical depletion region 220 may be formed in the semiconductor region 202, and by applying a control voltage to the non-insulative region 214, a horizontal depletion region 222 may be formed in the semiconductor region 202. In certain aspects, the non-insulative regions 206 and 214 may be coupled together (e.g., shorted, or coupled through an alternating-current (AC) coupling capacitor) via a signal path 230. In other aspects, the non-insulative regions 206 and 214 may be separately controlled in order to independently adjust the vertical and horizontal depletion regions 220, 222.

Figure 3A:
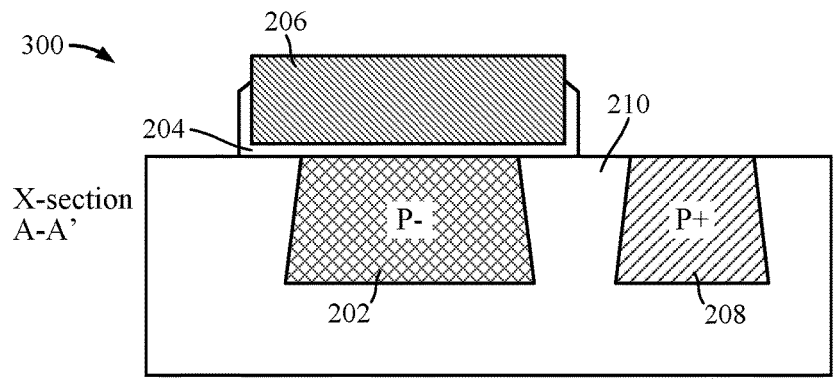
FIGS. 3A, 3B, and 3C illustrate cross-sectional views and a top-down view of a p-type TC device, in accordance with certain aspects of the present disclosure.
Figure 3B:
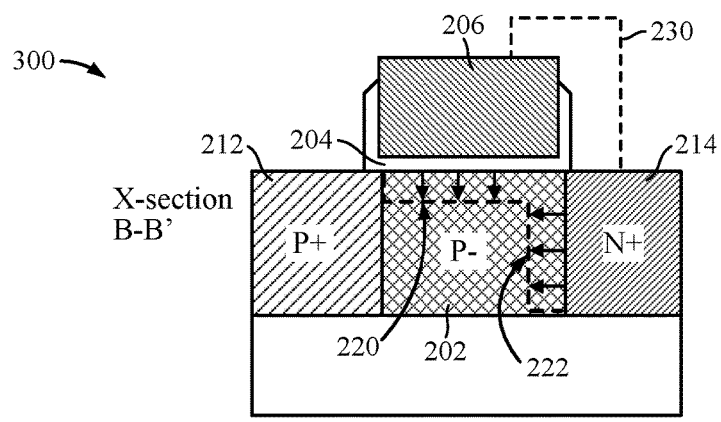
Figure 3C:
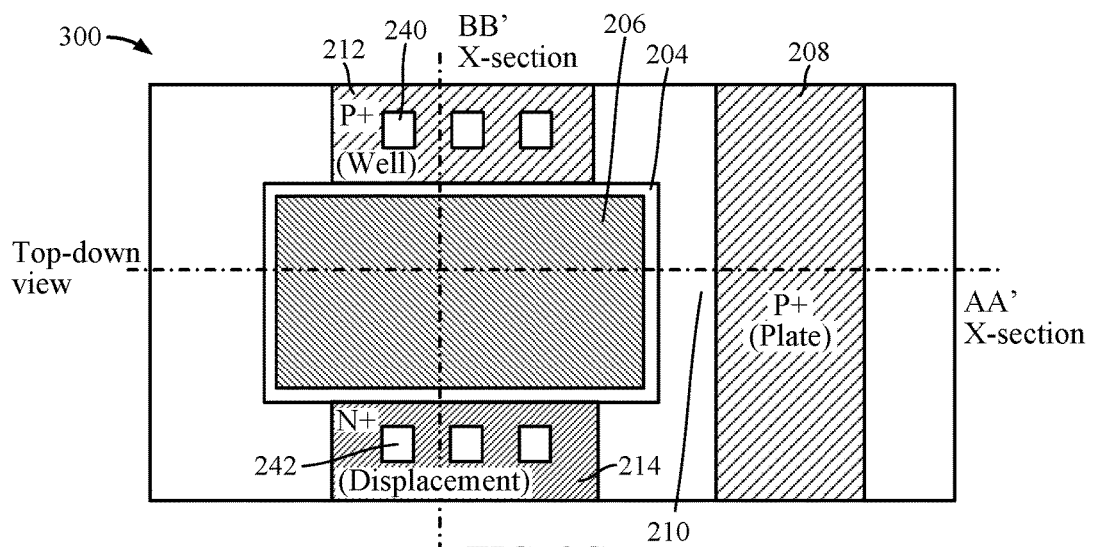

FIGS. 3A, 3B, and 3C illustrate cross-sectional views and a top-down view of a p-type TC device 300, in accordance with certain aspects of the present disclosure. FIG. 3A is a cross-section taken through line A-A' in FIG. 3C, and FIG. 3B is a cross-section taken through line B-B' in FIG. 3C. The TC device 300 is similar to the TC device 200, but implemented as a p-type TC device. In other words, p-type semiconductor is used for the TC device 300 where n-type semiconductor was used for the TC device 200, and vice versa.

Figure 4A:
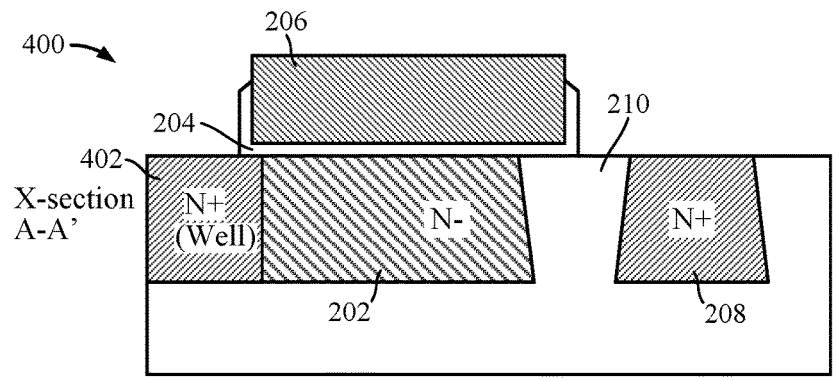
FIGS. 4A, 4B, and 4C illustrate cross-sectional views and a top-down view of a TC device having at least two displacement regions, in accordance with certain aspects of the present disclosure.
Figure 4B:
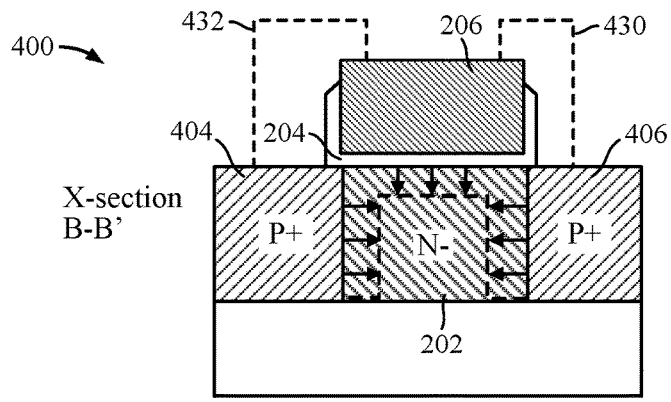
Figure 4C:
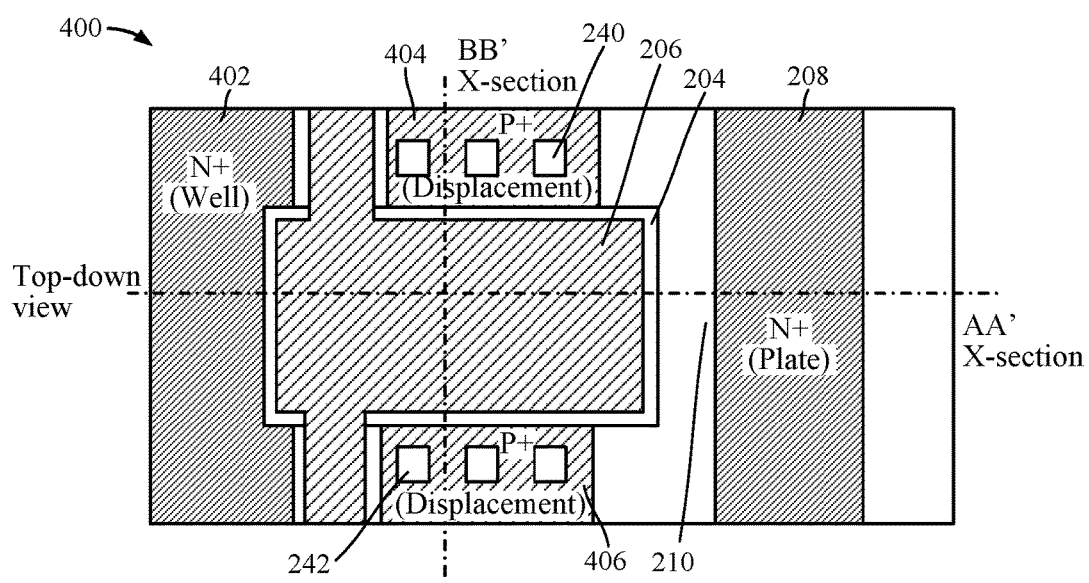

FIGS. 4A, 4B, and 4C illustrate cross-sectional views and a top-down view of a TC device 400, in accordance with certain aspects of the present disclosure. FIG. 4A is a cross-section taken through line A-A' in FIG. 4C, and FIG. 4B is a cross-section taken through line B-B' in FIG. 4C. In this case, the TC device 400 includes two non-insulative regions 404 and 406, which may be implemented as semiconductor regions having the same doping type, disposed on opposite lateral sides of the semiconductor region 202. Thus, the non-insulative regions 404 and 406 are configured as displacement regions for the TC device 400.

The TC device 400 also includes a non-insulative region 402 disposed on a lateral side of the semiconductor region 202. For example, the non-insulative regions 402 and 208 may be disposed on opposite lateral sides of the semiconductor region 202, and may be implemented using semiconductors having the same doping type. Thus, the non-insulative region 402 is configured as a well region for the TC device 400. Therefore, a control voltage applied to at least one of the non-insulative region 404, the non-insulative region 406, or the non-insulative region 206 (e.g., top gate region) may control the depletion regions in the semiconductor region 202, as illustrated in FIG. 4B, and adjust the capacitance between the non-insulative regions 208 and 402 (plate region and well region). In certain aspects, the non-insulative regions 404 and 406 may be coupled (e.g., shorted or coupled through an AC coupling capacitor) together, or may be separately controlled. In certain aspects, the non-insulative region 206 may be coupled (e.g., shorted or coupled through an AC coupling capacitor) to at least one of the non-insulative regions 404 and 406 via at least one of the signal paths 430 or 432.

Figure 5A:
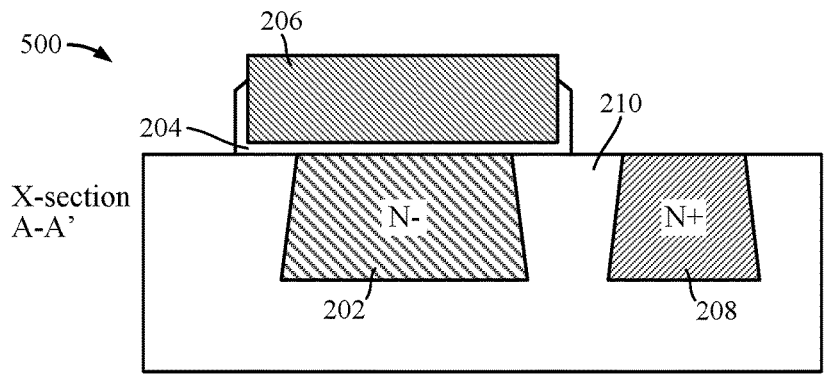
FIGS. 5A, 5B, and 5C illustrate cross-sectional views and a top-down view of an n-type metal-oxide-semiconductor (MOS) varactor, in accordance with certain aspects of the present disclosure.
Figure 5B:
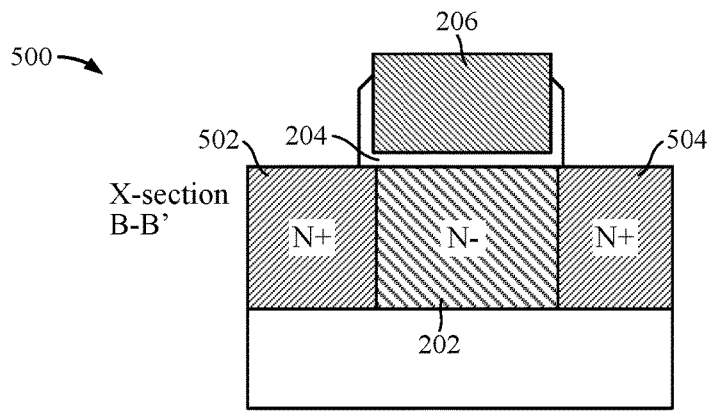
Figure 5C:
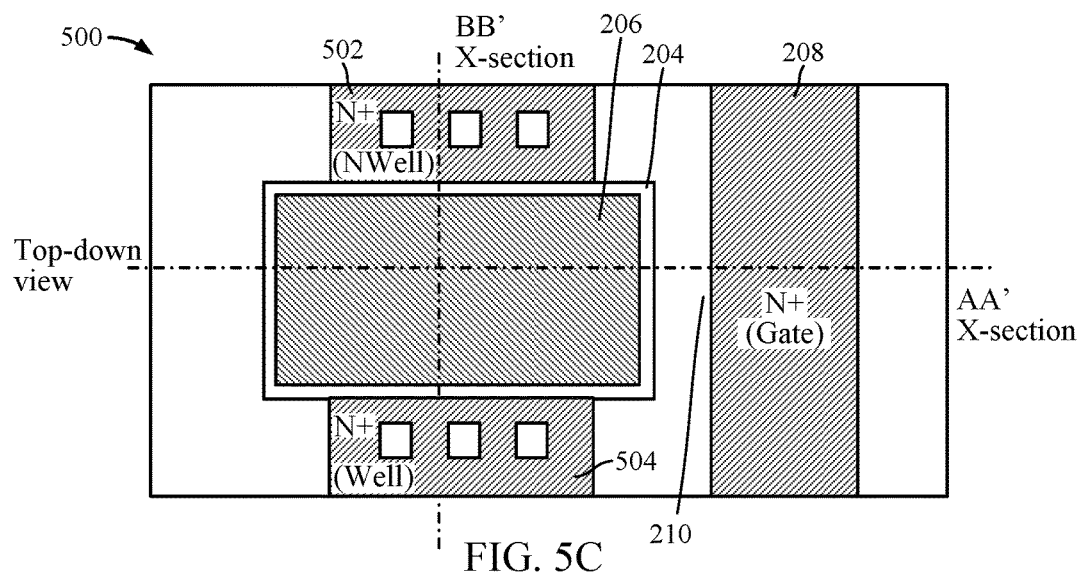

FIGS. 5A, 5B, and 5C illustrate cross-sectional views and a top-down view of an n-type metal-oxide-semiconductor (MOS) varactor 500, in accordance with certain aspects of the present disclosure. In this case, the semiconductor region 202 is disposed between non-insulative regions 502 and 504. The non-insulative regions 502 and 504 may be implemented using semiconductors having the same doping type as the semiconductor region 202 and the non-insulative region 208. Thus, the non-insulative region 208 is configured as a first terminal (e.g., gate terminal) of the MOS varactor 500, and the non-insulative regions 502 and 504, which may be shorted together, form the second terminal of the MOS varactor 500.

Figure 6A:
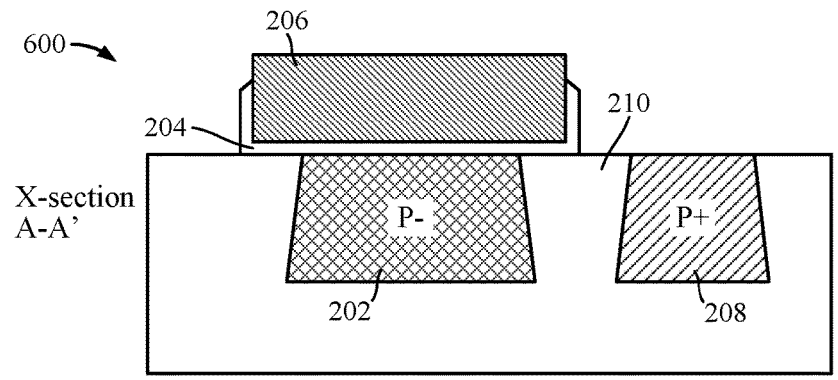
FIGS. 6A, 6B, and 6C illustrate cross-sectional views and a top-down view of a p-type MOS varactor, in accordance with certain aspects of the present disclosure.
Figure 6B:
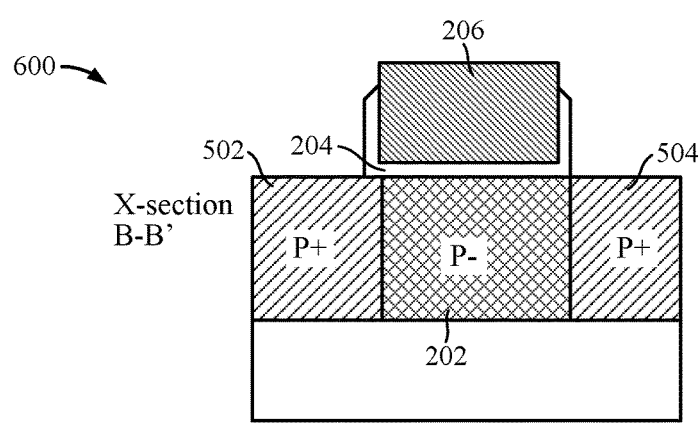
Figure 6C:
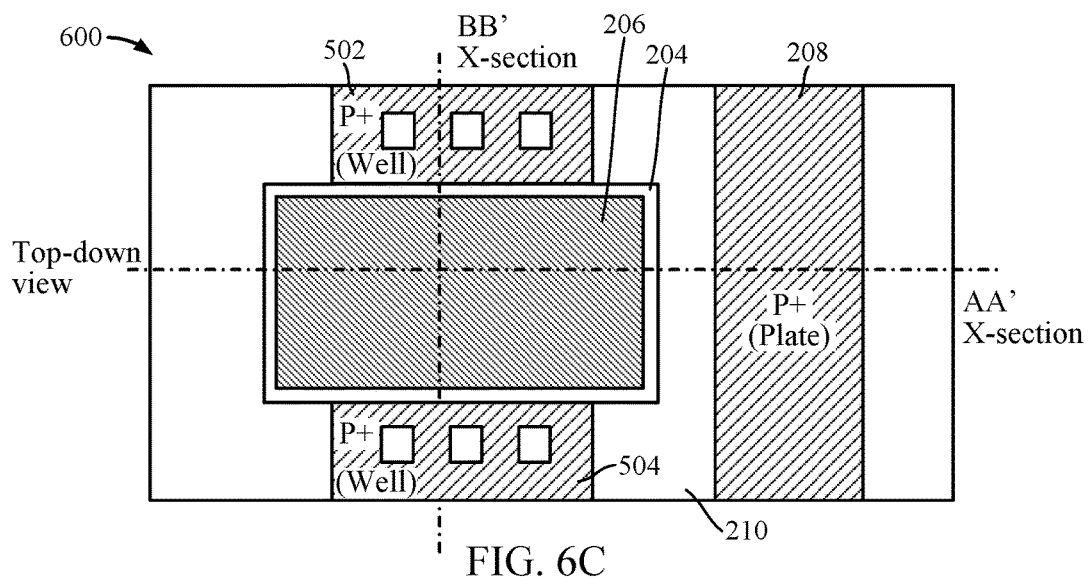

FIGS. 6A, 6B, and 6C illustrate cross-sectional views and a top-down view of a p-type MOS varactor 600, in accordance with certain aspects of the present disclosure. FIG. 6A is a cross-section taken through line A-A' in FIG. 6C, and FIG. 6B is a cross-section taken through line B-B' in FIG. 6C. The MOS varactor 600 is similar to the MOS varactor 500, but implemented as a p-type MOS varactor. In other words, p-type semiconductor is used for the MOS varactor 600 for regions where n-type semiconductor was used for the MOS varactor 500, and vice versa.

Figure 7A:
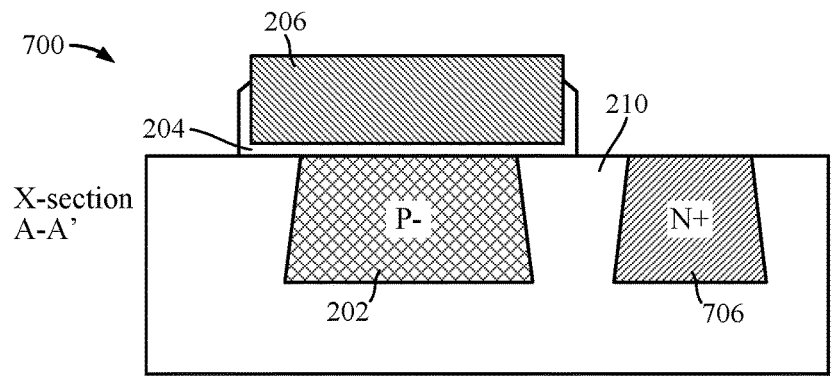
FIGS. 7A, 7B, and 7C illustrate cross-sectional views and a top-down view of an n-type metal-oxide-semiconductor field-effect transistor (MOSFET), in accordance with certain aspects of the present disclosure.
Figure 7B:
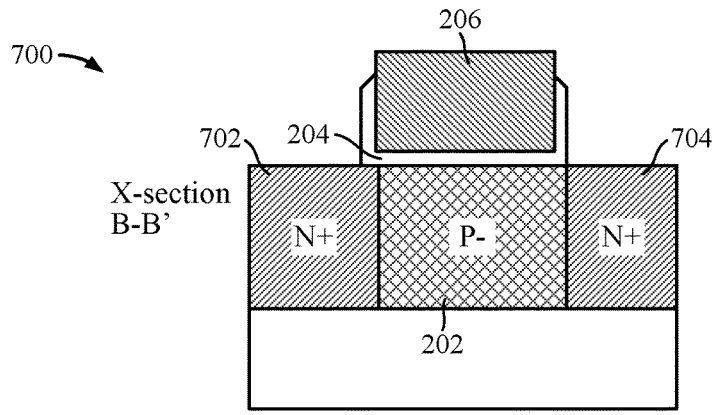
Figure 7C:
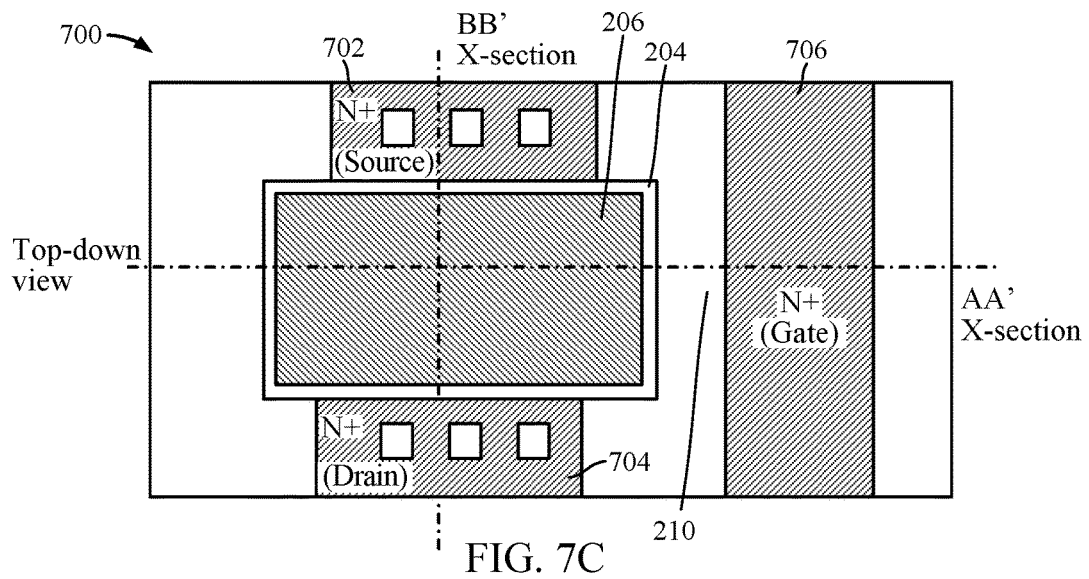

FIGS. 7A, 7B, and 7C illustrate cross-sectional views and a top-down view of an n-type metal-oxide-semiconductor field-effect transistor (MOSFET) 700, in accordance with certain aspects of the present disclosure. FIG. 7A is a cross-section taken through line A-A' in FIG. 7C, and FIG. 7B is a cross-section taken through line B-B' in FIG. 7C. As illustrated, the MOSFET 700 includes non-insulative regions 702 and 704 (e.g., source and drain regions) disposed on opposite lateral sides of the semiconductor region 202, and a non-insulative region 706 disposed on another lateral side of the semiconductor region 202.

The non-insulative regions 702, 704, and 706 may be implemented using semiconductors having an opposite doping type as the semiconductor region 202. Thus, the non-insulative region 706 is electrically isolated from the semiconductor region 202 by the dielectric region 210. Therefore, the non-insulative region 706 is configured as a gate region for the MOSFET 700. Moreover, the non-insulative regions 702 and 704 are configured as source and drain regions, respectively, for the MOSFET 700, as illustrated.

Figure 8A:
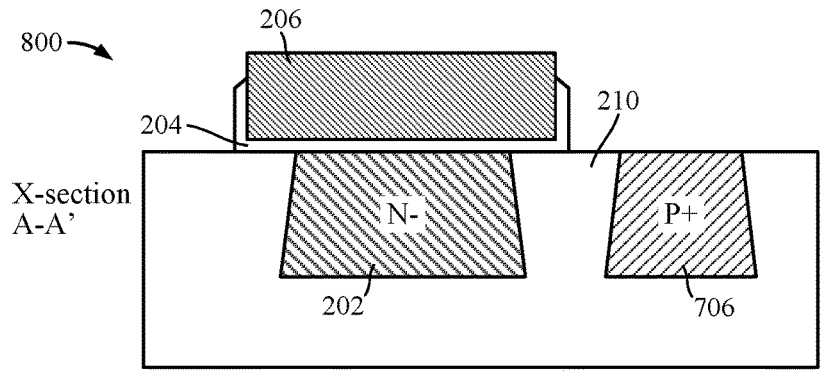
FIGS. 8A, 8B, and 8C illustrate cross-sectional views and a top-down view of a p-type MOSFET, in accordance with certain aspects of the present disclosure.
Figure 8B:
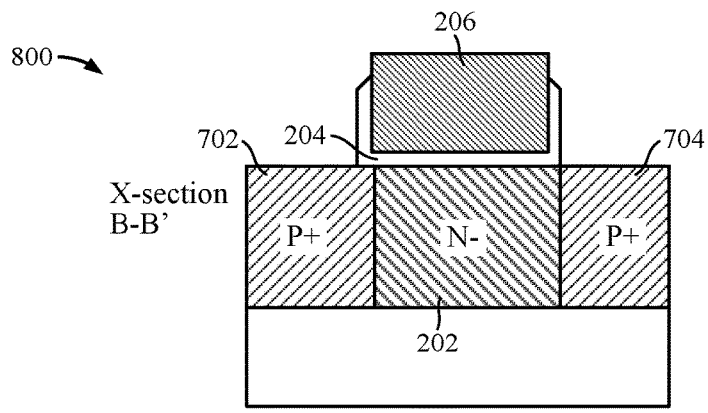
Figure 8C:
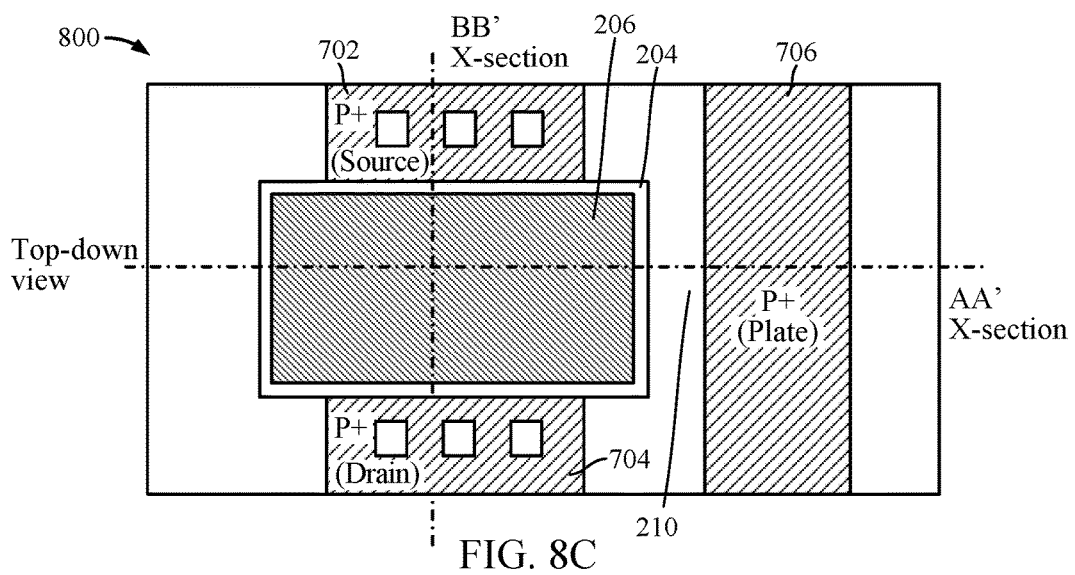

FIGS. 8A, 8B, and 8C illustrate cross-sectional views and a top-down view of a p-type MOSFET 800, in accordance with certain aspects of the present disclosure. FIG. 8A is a cross-section taken through line A-A' in FIG. 8C, and FIG. 8B is a cross-section taken through line B-B' in FIG. 8C. The MOSFET 800 is similar to the MOSFET 700, but implemented as a p-type MOSFET. In otherwords, p-type semiconductor is used for the MOSFET 800 for regions where n-type semiconductor is used for the MOSFET 700, and vice versa.

Figure 9:
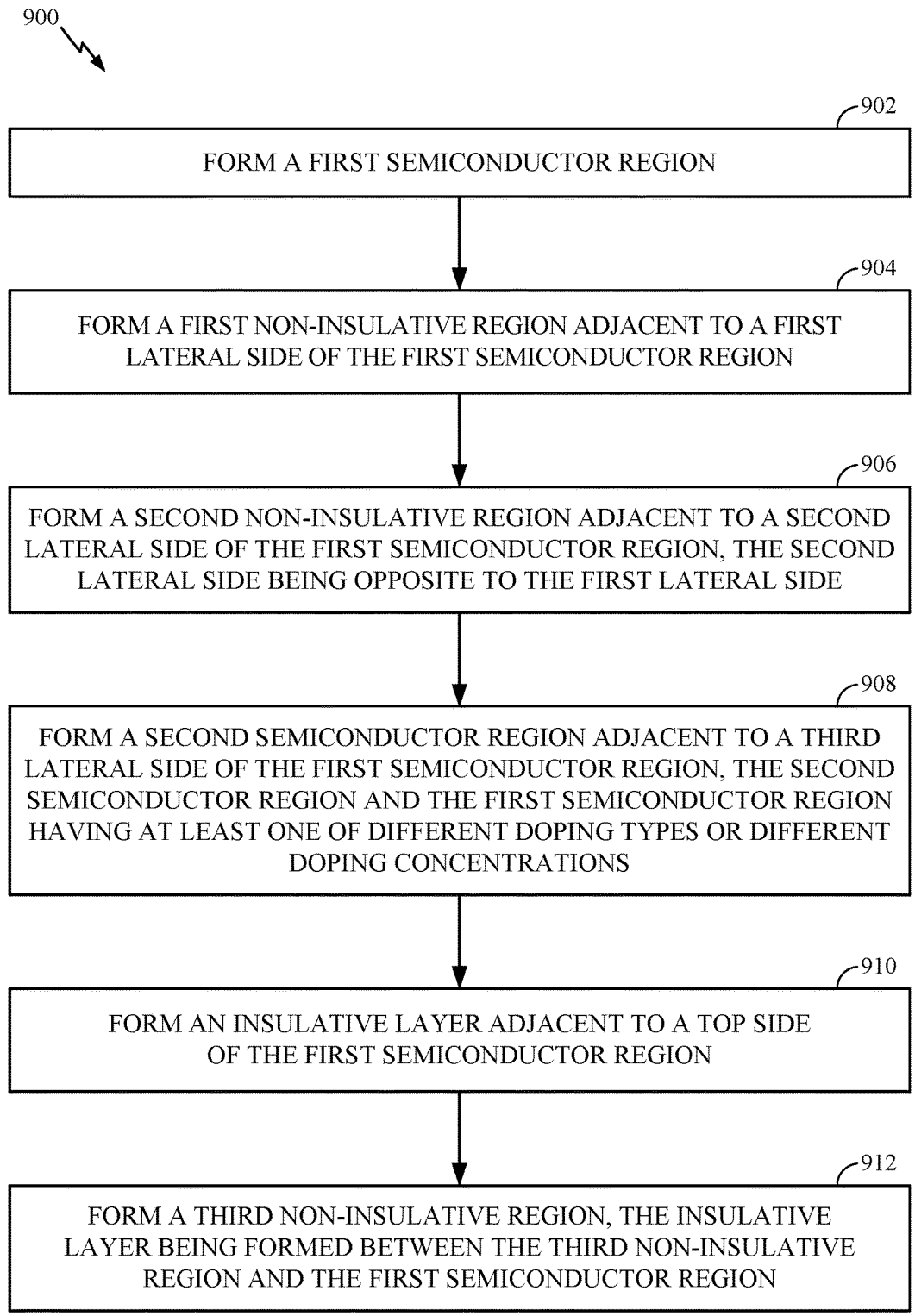
FIG. 9 is a flow diagram of example operations for fabricating a semiconductor device, in accordance with certain aspects of the present disclosure.

FIG. 9 is a flow diagram of example operations 900 for fabricating a semiconductor device, in accordance with certain aspects of the present disclosure. The operations 900 may be performed, for example, by a semiconductor processing chamber.

Operations 900 may begin, at block 902, by forming a first semiconductor region (e.g., semiconductor region 202), and at block 904, forming a first non-insulative region (e.g., non-insulative region 212) adjacent to a first lateral side of the first semiconductor region. At block 906, a second non-insulative region (e.g., non-insulative region 214) is formed adjacent to a second lateral side of the first semiconductor region, the second lateral side being opposite to the first lateral side. At block 908, a second semiconductor region (e.g., non-insulative region 208) is formed adjacent to a third lateral side of the first semiconductor region, the second semiconductor region and the first semiconductor region having at least one of different doping types or different doping concentrations. At block 910, an insulative layer (e.g., insulative layer 204) is formed adjacent to a top side of the first semiconductor region, and at block 912, a third non-insulative region (e.g., non-insulative region 206) is formed, the insulative layer being formed between the third non-insulative region and the first semiconductor region.

In certain aspects, the third non-insulative region is shorted to the second non-insulative region. In certain aspects, the first non-insulative region comprises a third semiconductor region, and the second non-insulative region comprises a fourth semiconductor region, the third semiconductor region having a different doping type than the fourth semiconductor region. In this case, a capacitance between the second semiconductor region and the third semiconductor region may be configured to be adjusted by applying a control voltage to the fourth semiconductor region with respect to the second or third semiconductor region.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A semiconductor device comprising:
   a first semiconductor region;
   a first non-insulative region disposed adjacent to a first lateral side of the first semiconductor region;
   a second non-insulative region disposed adjacent to a second lateral side of the first semiconductor region, the second lateral side being opposite to the first lateral side;
   a second semiconductor region disposed adjacent to a third lateral side of the first semiconductor region, the second semiconductor region and the first semiconductor region having at least one of different doping types or different doping concentrations;
   an insulative layer adjacent to a top side of the first semiconductor region; and
   a third non-insulative region, the insulative layer being disposed between the third non-insulative region and the first semiconductor region.

2. The semiconductor device of claim 1, wherein the third non-insulative region is shorted to the second non-insulative region.

3. The semiconductor device of claim 1, wherein:
   the first non-insulative region comprises a third semiconductor region; and
   the second non-insulative region comprises a fourth semiconductor region, the third semiconductor region having a different doping type than the fourth semiconductor region.

4. The semiconductor device of claim 3, wherein a capacitance between the second semiconductor region and the third semiconductor region is configured to be adjusted by applying a control voltage to the fourth semiconductor region with respect to the second or third semiconductor region.

5. The semiconductor device of claim 1, further comprising:
a third semiconductor region disposed adjacent to a fourth lateral side of the first semiconductor region, the third semiconductor region and the first semiconductor region having at least one of different doping types or different doping concentrations and the fourth lateral side being opposite to the third lateral side.

6. The semiconductor device of claim 5, wherein the third semiconductor region and the second semiconductor region have a same doping type.

7. The semiconductor device of claim 1, wherein:
the first non-insulative region comprises a third semiconductor region; and
the second non-insulative region comprises a fourth semiconductor region, the third semiconductor region having a same doping type as the fourth semiconductor region.

8. The semiconductor device of claim 7, wherein:
the second semiconductor region has a different doping type than the third and fourth semiconductor regions.

9. The semiconductor device of claim 8, further comprising:
a fifth semiconductor region disposed adjacent to a fourth lateral side of the first semiconductor region, the fifth semiconductor region and the second semiconductor region having a same doping type and the fourth lateral side being opposite to the third lateral side.

10. The semiconductor device of claim 9, wherein a capacitance between the second semiconductor region and the fifth semiconductor region is configured to be adjusted by applying a control voltage to at least one of the third or fourth semiconductor region with respect to the second or fifth semiconductor region.

11. The semiconductor device of claim 7, wherein the third semiconductor region is shorted to the fourth semiconductor region.

12. The semiconductor device of claim 7, wherein the second semiconductor region has the same doping type as the third and fourth semiconductor regions.

13. The semiconductor device of claim 12, wherein the first semiconductor region has the same doping type as the second semiconductor region.

14. The semiconductor device of claim 12, wherein the first semiconductor region has a different doping type than the second semiconductor region.

15. The semiconductor device of claim 1, further comprising:
a dielectric region disposed between the second semiconductor region and the first semiconductor region.

16. The semiconductor device of claim 1, wherein a distance between the first and second semiconductor regions is at most 40 nanometers.

17. A method for fabricating a semiconductor device comprising:
forming a first semiconductor region;
forming a first non-insulative region adjacent to a first lateral side of the first semiconductor region;
forming a second non-insulative region adjacent to a second lateral side of the first semiconductor region, the second lateral side being opposite to the first lateral side;
forming a second semiconductor region adjacent to a third lateral side of the first semiconductor region, the second semiconductor region and the first semiconductor region having at least one of different doping types or different doping concentrations;
forming an insulative layer adjacent to a top side of the first semiconductor region; and
forming a third non-insulative region, the insulative layer being formed between the third non-insulative region and the first semiconductor region.

18. The method of claim 17, wherein the third non-insulative region is shorted to the second non-insulative region.

19. The method of claim 17, wherein:
the first non-insulative region comprises a third semiconductor region; and
the second non-insulative region comprises a fourth semiconductor region, the third semiconductor region having a different doping type than the fourth semiconductor region.

20. The method of claim 19, wherein a capacitance between the second semiconductor region and the third semiconductor region is configured to be adjusted by applying a control voltage to the fourth semiconductor region with respect to the second or third semiconductor region.

* * * * *